United States Patent [19]
Schoner et al.

[11] Patent Number: 6,137,734
[45] Date of Patent: Oct. 24, 2000

[54] COMPUTER MEMORY INTERFACE HAVING A MEMORY CONTROLLER THAT AUTOMATICALLY ADJUSTS THE TIMING OF MEMORY INTERFACE SIGNALS

[75] Inventors: Brian F. Schoner, Fremont; Arvind B. Patwardhan, San Jose, both of Calif.

[73] Assignee: LSI Logic Corporation, Milpitas, Calif.

[21] Appl. No.: 09/281,381

[22] Filed: Mar. 30, 1999

[51] Int. Cl.[7] ...................................... G11C 7/00
[52] U.S. Cl. ................ 365/194; 365/201; 365/230.08
[58] Field of Search ................................. 365/194, 233, 365/191, 201, 230.08

[56]                    References Cited
              U.S. PATENT DOCUMENTS 4,991,169   2/1991   Davis et al. ............................. 370/77
5,530,874   6/1996   Emery et al. ........................... 395/735
5,732,094   3/1998   Petersen et al. ....................... 371/51.1

Primary Examiner—David Nelms
Assistant Examiner—Thong Le
Attorney, Agent, or Firm—Conley, Rose & Tayon, PC; B. Noel Kivlin

[57]                    ABSTRACT

A memory controller features programmable delay buffers that allow the memory interface signals to be automatically adjusted. By fine tuning the delay values, the memory controller can compensate for impedance characteristics that affect the memory interface timing. The memory controller includes a built-in self test mode, in which it runs a series of memory tests using a plurality of different delay combinations for the delay buffers. After running the built-in self test, the memory controller programs the delay buffers to values which allow the memory transactions to occur without errors, ensuring optimal memory interface timing.

19 Claims, 6 Drawing Sheets

COMPUTER MEMORY INTERFACE HAVING A MEMORY CONTROLLER THAT AUTOMATICALLY ADJUSTS THE TIMING OF MEMORY INTERFACE SIGNALS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention relates generally to interfacing computer memory devices and particularly to computer memory interfaces. More particularly, the present invention relates to a system that automatically adjusts the timing of memory interface signals.

2. Background of the Invention

Computer systems, which can be generally defined as electronic devices which retrieve, process, and store data, require a certain amount of computer memory in which to store computer programs, data, and variables used during processing. Computer memory is more commonly known as random access memory (RAM), since the computer may access any portion of the memory at any time. Most RAM devices in use today are manufactured to be volatile, meaning that the memory contents are valid only when the RAM devices are supplied with electric power. Some computer devices use nonvolatile RAM as well, devices which hold memory contents even when the power supply is cut off. Devices that use random access memory typically include a memory controller that couples to the RAM. The memory controller receives memory requests from the computer system and transmits the proper sequence of signals to the RAM to perform the memory transactions. The computer system is often called a "host system," since it includes the memory controller that interfaces the memory device.

Currently, there are many types of RAM architectures, two common types of volatile RAM being dynamic RAM (DRAM) and static RAM (SRAM). Each storage element (or "bit") of SRAM is constructed using a flip-flop, a basic storage device constructed typically requiring approximately six transistors. In contrast, DRAM requires only one transistor per bit and is therefore generally cheaper and more compact than SRAM. SRAM is typically faster than DRAM and much simpler to use, however. Consequently, SRAM is typically used in computer devices that require fast but small memories, while DRAM is typically used when a large amount of RAM is needed. In fact, many microprocessor-based systems use a combination of DRAM and SRAM, constructing the large main memory from DRAM chips and using SRAM for the smaller memory devices, such as memory caches for the processor. A number of DRAM architectures are available, including synchronous DRAM (SDRAM), extended data output DRAM (EDO DRAM), and Rambus™ DRAM (RDRAM).

Conventional DRAM chips receive a plurality of input signals which define parameters such as the location, or address, of the memory data and which transmit the memory data. A read or write transaction with a DRAM generally involves two steps. First, address and control signals are asserted to the DRAM, allowing the DRAM to prepare for the data transfer. Second, the DRAM reads or writes the data, completing the data transfer. Synchronous DRAM's operate similarly to conventional DRAM's, although SDRAM signals include a reference clock signal to which the other SDRAM signals are synchronized. SDRAM's also typically support pipelining, which allows the SDRAM accept address and control signals for a one memory transaction while transacting a previous memory request via the data signals. For a more detailed description of DRAM, SDRAM, and other memory devices, refer to *The Art of Electronics* by Horowitz and Hill, pages 812–820 (Cambridge University Press, 1989) or *Computer Organization & Design* by Hennessy and Patterson, pages B21–B35 (Morgan Kaufmann Publishers, 1994).

An important consideration for selecting a memory device in a computer system is the speed at which data can be written to and read from the memory device. Memory speed is also commonly known as "bandwidth," a term which refers to the frequency content of the memory signals. Generally, a higher speed memory device is more efficient, because it can supply data at a faster rate (or "higher bandwidth"). In fact, memory bandwidth is often considered a crucial factor in evaluating the performance of processor-based systems. The emergence of new memory technologies and improvements in existing memory architectures are helping to increase current memory bandwidths, thus improving computer performance.

Typical computer systems use SDRAM's that operate at frequencies of up to approximately 100 million cycles per second, or 100 megahertz (MHz). More recently, SDRAM's operating at 200 MHz have been developed. Despite the increased performance that the newer, faster devices provide, these devices can be challenging to use due to timing requirements. A signal that oscillates at 200 MHz has a cycle duration, known as the "period," of 5 billionths of a second, or 5 nanoseconds (ns). Digital signals typically oscillate repeatedly between two voltages: a low voltage and a high voltage. The period of the signal describes the length of time between adjacent rising edges of the signal, where the rising edge of the signal represents the transition from the low voltage to the high voltage. To ensure adequate performance, the SDRAM signals must be transmitted to within an accuracy of about one-half the period, or no more than 2.5 ns for a 200 MHz device. If memory timing requirements are not met, then the memory device may not function properly, and the memory read and write data may contain errors.

Achieving signal timing accuracy can be very difficult in practice. The natural laws of electromagnetics which govern the transmission of electronic signals tend to introduce various amounts of delay and distortion to high frequency signals. These "electromagnetic" effects are commonly known as capacitive (or inductive) loading, which causes signal delay, and ringing, which causes signal distortion. In addition to the signal bandwidth, the physical location and dimensions of the signal conductors (known as signal "traces") also affect the transmission behavior, as does the level of current used to transmit the signals.

Under capacitive loading, certain signals may travel across the circuit board at a delay with respect to the synchronizing clock signal. It is common to adjust for signal delays by inserting delay buffers, devices which delay electronic signals, into the SDRAM interface. Often, each signal transmitted or received by the memory controller will be delay-buffered. By setting the proper amount of delay for each buffer, the memory signals can be synchronized with the clock signal.

A significant problem with using delay buffers is that the optimum delay can be difficult to predict before the circuit board is manufactured. First, different memory technologies may include different signals or may operate at different speeds. To accommodate a wide variety of memory devices, the delay buffers must be specially configured for each new memory system design. Even if the same type of memory device is used in a different computer system, however, differences in signal traces on the circuit board can change the required delay settings considerably. In addition, it is often desirable for circuit designers to use a standard memory interface that supports a variety of standard SDRAM devices. Such a modular design is generally more flexible and economical than designing a custom memory interface. Because memory devices may vary slightly among manufacturers, however, different SDRAM devices may require unique delay settings and require costly experimentation to determine the best delay settings.

Another problem is that, due to the inherent limitations of present computer chip and circuit board technology, the capacitive loading can fluctuate slightly from board to board during manufacturing. Thus, even a carefully designed circuit board may not meet memory signal timing requirements due to manufacturing imperfections.

For the foregoing reasons, a device capable of automatically optimizing and adjusting the memory signal timing of an existing computer system would greatly improve the speed and reliability of memory performance. Despite the apparent advantages that such a system would provide, to date no device has been developed that provides these features.

SUMMARY OF THE INVENTION

Accordingly, there is provided herein a memory controller capable of interfacing a memory device, comprising an memory request unit and a memory test unit. Both the memory request unit and the memory test unit transmit address, control, and data write signals and receive data read signals for performing memory transactions. The memory request unit couples to a host bus and performs memory transactions in response to memory requests from a host computer system. The memory test unit also couples to the host bus and performs memory test sequences in response to a request from the host computer system. The memory controller includes a bank of multiplexers that receive the output signals from the memory test unit and memory request unit. Thus, either the memory test unit or memory request unit accesses main memory at any given time. In a preferred embodiment, the memory test unit generates the switching signals that determine the states of the multiplexers that select between the memory request unit and the memory test unit.

The memory controller includes a plurality of programmable transmit delay buffers that delay the control, address, and data write signals. The memory test unit is capable of changing the delay values of the transmit delay buffers to adjust the timing of the signals transmitted to a memory device. The memory controller also includes a synchronous data register that receives data read signals from a memory device and which receives a clock signal for timing. A programmable receive delay buffer is further included to delay the clock signal delivered to the data register. The memory test unit is capable of changing the delay value of the receive delay buffer in order to adjust the timing of the data signals received from the memory device. The memory controller thus is capable of adjusting the timing of transmitted memory interface signals and received memory interface signals by programming the transmit delay buffers and receive delay buffer.

By properly setting the transmit and receive delays, the memory controller can perform read and write transactions without timing errors occurring. Thus, the transmit and receive delay settings are considered optimal if they facilitate error-free memory transactions. To determine optimal transmit and receive delay settings, the memory test unit performs a memory test using each possible combination of transmit and receive delay settings. Each memory test comprises a series of read and write transactions to every address within the memory device. For a given memory address, a write transaction gene rally occurs first, followed by a read transaction. Subsequent read and write transactions may occur, as well, in which the test data is changed to examine the memory interface more thoroughly. If the read data does not match the write data, then an error is declared, and it is concluded that the current combination of transmit and receive delays does not meet the timing requirements of the memory interface. The memory test unit tracks which of the transmit and receive delay settings resulted in memory errors. Following the memory tests, the test unit sets the transmit and receive delays to values under which no memory errors occurred during the memory tests.

The memory test unit comprises a test control logic, data receive logic, address comparing logic, and a plurality of test registers. The test registers include a mode register, a run register, a pattern register, an address counter, and a sticky register. The test control logic transmits address, control, and data write signals for performing memory transactions and is capable of reading and writing to the test registers. The test control logic also provides signals to select the states of the multiplexers and to adjust the programmable delay buffers. The test registers couple to the host bus so that a host computer system can read and write to the test registers. The host computer writes instructions to the mode register that describe the type of test to be executed. The run register is used by the host register to initiate memory tests. When a bit in the run register is set, the test control logic commences an automatic memory test sequence. The pattern register stores a data pattern that is used to generate memory write signals, and the address counter holds the memory address that is used to read from and write to memory. The address counter can be incremented or decremented for efficiently traversing the memory device.

The receive logic receives the data read signals and determines if the read data matches the write data in the pattern register. If the read data does not match the write data, indicating that a memory error occurred, then the receive logic asserts a FLAG signal to the sticky register.

The sticky register includes a bit that represents each combination of transmit and receive delay settings. If the FLAG signal is asserted to the sticky register, then the sticky register asserts a bit associated with the current delay settings. If the FLAG signal is subsequently deasserted to a bit that is already asserted, then the bit "sticks," remaining asserted. Thus, following the memory tests, the contents of the sticky register indicate which delay settings were optimal, since sub-optimal delay settings, which resulted in memory errors, were recorded as asserted bits in the sticky pass register. The receive logic thus "passes" or "fails" the memory tests.

The address control logic determines whether the memory address in the address counter is within the proper range of the memory device being used. If the memory address is out of range during any write transaction, then the test control logic does not assert the write enable signal for that memory device, and the receive logic does not flag memory errors during that read transaction.

To select an optimal delay setting for the transmit and receive delay buffers following the automatic memory tests, the test control logic scans the sticky pass register for deasserted sticky bits. The test control logic first determines which transmit delay value resulted in the greatest number of deasserted sticky bits, choosing that delay value for the transmit delay buffers. The test control logic then determines which receive delay value resulted in the greatest number of deasserted sticky bits, choosing that delay value for the receive delay buffers.

Thus, the present invention comprises a combination of features and advantages that enable it to substantially advance the art by providing a memory interface capable of automatically adjusting the memory interface timing. The memory controller is capable of conducting an automatic memory test to determine optimal delay settings for the memory interface signals. The automatic memory test can be initiated by a host computer system and is handled entirely by the memory controller. Such a system advantageously permits the memory interface to be integrated into virtually any computer system using any type of memory technology. Because the transmit and receive delays can be automatically programmed, the memory interface timing can be fine-tuned within the system for optimal performance. These nd various other characteristics and advantages of the present invention will be readily apparent to those skilled in the art upon reading the following detailed description and by referring to the accompanying drawings.

BRIEF DESCRIPTION OF THE DRAWINGS

A better understanding of the present invention can be obtained when the following detailed description is considered in conjunction with the following drawings, in which:

FIGS. 5-1, 5-2, and 5-3 illustrate the memory transactions performed by the memory controller during a built-in self test.

DETAILED DESCRIPTION OF PREFERRED EMBODIMENTS

Figure 1:
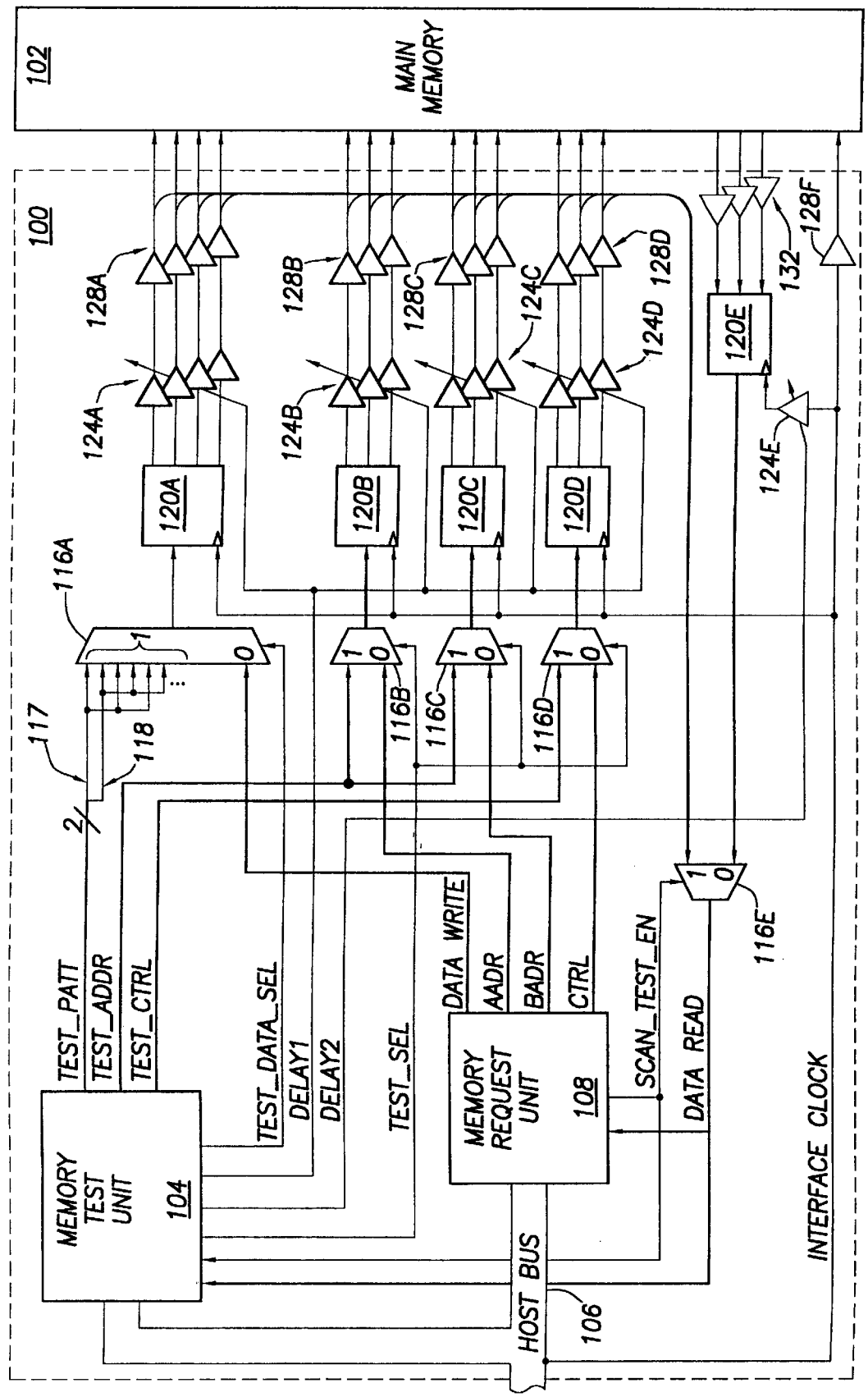
FIG. 1 illustrates a memory controller constructed in accordance with a preferred embodiment of the invention and including a memory test unit.

Turning now to the drawings, FIG. 1 illustrates a memory controller 100 constructed in accordance with a preferred embodiment and comprising a memory request unit 108 coupled to a built-in self test (BIST) unit 104. Memory controller 100 couples to an SDRAM device 102 and is capable of performing memory read and write transactions with main memory 102. A host bus 106 coupled to the request unit 108 permits a host computer (not shown) to submit memory requests to the memory controller 100 via the host bus 106. The memory test unit 104 also couples to the host bus 106. Memory controller 100 preferably is adapted to receive an INTERFACE CLOCK signal from the host bus 106 for providing timing and synchronization. In alternative embodiments, the INTERFACE CLOCK signal may be generated within the memory interface 100. The INTERFACE CLOCK signal also drives an output buffer 128F, which provides the INTERFACE CLOCK signal to the main memory 102 for synchronization with the memory controller 100.

Memory request unit 108 provides DATA WRITE, AADR, BADR, and CTRL signals for transacting memory requests with main memory 102. Test unit 104 is capable of providing signals for transacting memory requests as well, including the TEST_CTRL, TEST_PATT, and TEST_ADDR signals. The TEST_PATT and DATA WRITE signals feed a multiplexer 116A.

Test unit 104 provides a TEST_DATA_SEL signal to control the state of the multiplexer 116A, so that the output of multiplexer 116A is chosen as either the TEST_PATT input signals or the DATA WRITE signals. Another switching device, multiplexer 116B, receives the AADR and TEST_ADDR signals. The memory test unit 104 provides a TEST_SEL signal that controls the state of multiplexer 116B, so that the output of multiplexer 116B is chosen as either the TEST_ADDR signals or the AADR signals. A multiplexer 116C also receives the TEST_ADDR signals and is controlled by the state of the TEST_SEL signal. The BADR signals provide a second input to multiplexer 116C, so that the output of multiplexer 116C is selected as either the TEST_ADDR or BADR signals. A fourth multiplexer 116D receives the TEST_CTRL and CTRL input signals and is controlled by the TEST_SEL as well. Hence, multiplexer 116D provides output signals comprising either the TEST_CTRL signals or the CTRL signals, depending on the state of TEST_SEL.

A bank of registers 120A–D receives the output signals from multiplexers 116A–D. Multiplexer 116A drives register 120A, while multiplexer 116B provides its output signal to register 120B. Multiplexers 116C and 116D feed registers 120C and 120D, respectively. Registers 120A–D preferably are capable of storing logic values internally and providing output signals that indicate the stored logic values. The stored logic values are updated during each cycle of the INTERFACE CLOCK signal to represent the logic values of the input signals coincident with each rising edge of the INTERFACE CLOCK signal. It should be understood that the memory interface 100 may provide any number of output signals to main memory 102, according to the specific bus protocol necessary for performing memory transactions.

So that the output signal timing can be adjusted, banks of programmable delay buffers 124A–D receive the output signals from registers 120A–D. Memory controller 100 preferably includes one delay buffer 124 to drive each output signal provided by the registers 120. Each delay buffer 124 provides an output signal that is time-delayed with respect to its input signal. In a preferred embodiment, the memory test unit 104 provides a DELAY1 signal to the delay buffers 124A–D to adjust the delay value. It should be understood that the delay values may be adjusted independently for each buffer, however, without departing from the principles described herein.

Each delay buffer 124 feeds an output drive buffer 128, as shown in FIG. 1. The output buffers 128 maintain steady output currents for transmitting the memory signals to main memory 102. Similarly, a group of receivers 132 is included for receiving data read signals from the main memory 102.

Only three signals are received from the main memory 102 in FIG. 1 for illustration, although it should be understood that the memory interface 100 may receive any number of data signals from main memory 102. Receivers 132 drive register 120E, which is synchronized to the INTERFACE CLOCK signal. A delay buffer 124E preferably is disposed between the INTERFACE CLOCK signal and register 120E so that the timing of register 120E can be offset with respect to the INTERFACE CLOCK signal. To program the amount of delay offset, test unit 104 provides a DELAY2 signal to delay buffer 124E. The register 120E feeds multiplexer 116E, the state of which is controlled by a SCAN_TEST_EN signal from the request unit 108. Multiplexer 116E also receives the output signals transmitted by the output buffers 128A–D and provides the DATA READ signals to the request unit 108 and the test unit 104. The test unit 104 also receives the SCAN_TEST_EN signal.

The main memory 102 preferably includes a conventional two-port synchronous dynamic random access memory (SDRAM) device or an array of memory devices in which application programs and data are stored. It should be noted, however, that main memory 102 may comprise any suitable type of memory such as dynamic random access memory ("DRAM"), including any of the various types of DRAM circuits, such as extended data output dynamic random access memory ("EDO DRAM"), synchronous dynamic random access memory ("SDRAM"), or Rambus™ dynamic random access memory ("RDRAM"). Further, main memory 102 may include any number of read and write ports as desired.

The memory request unit 108 generally comprises the circuitry for performing data read and write transactions with main memory 102. Request unit 108 preferably is capable of receiving memory requests and data and address input instructions via the host bus 106. In a preferred embodiment, request unit 108 is also capable of receiving configuration and command signals from the host unit which may instruct the memory controller 100 to perform configuration sequences or tests. To perform memory transactions, the request unit 108 preferably asserts the DATA WRITE, AADR, BADR, and CTRL signals according to the SDRAM protocol. The DATA WRITE signals transmit data that is to be written to main memory 102. The AADR signals hold the memory address for read transactions and are therefore transmitted to the read address port (not specifically shown) of the main memory 102. Similarly, the BADR signals carry the memory address for write transactions and are therefore transmitted to the write address port (not specifically shown) of the memory device 102. The CTRL lines preferably carry the data mask (DQM), column address strobe (CAS), row address strobe (RAS), chip select (CS), clock enable (CKE), write enable (WE), bank address (BA), and output enable (OE) control signals. Request unit 108 asserts the SCAN_TEST_EN signal, which controls the state of multiplexer 116E, when a scan test is performed. When the SCAN_TEST_EN signal is asserted, the DATA READ signal mirrors the output signals driven by the output buffers 128A–D, bypassing the actual data transmitted from the main memory 102.

The multiplexers 116A–D permit either the test unit 104 or request unit 108 to manipulate the memory device 102. During normal operation of the memory controller 100, the TEST_DATA_SEL and TEST_SEL lines are deasserted, allowing the request unit 108 to perform memory transactions. Accordingly, the memory controller 100 may be included within a host computer system (not specifically shown) and is adapted to accept and perform memory read and write transactions with the memory device 102 from the host system.

The test unit 104 also provides TEST_PATT, TEST_ADDR, and TEST_CTRL signals for accessing the memory 102, as well as TEST_DATA_SEL and TEST_SEL signals for controlling the output signals of the multiplexers 116A–D. The TEST_PATT signal preferably comprises a pair of signals for providing data values to main memory 102. Preferably, the first TEST_PATT signal 117 drives the even-numbered data lines, while the second TEST_PATT signal 118 drives the odd-numbered data lines. The TEST_PATT signals 117 and 118 thus provide an entire array of data signals to be transmitted to main memory 102, either comprising all 0's, all 1's, or alternating 1's and 0's, depending on the values of signals 117 and 118. The test unit 104 provides TEST_ADDR signals to multiplexers 116B and 116C for transmitting memory addresses to the write and read ports of the main memory 102. Likewise, the TEST_CTRL lines provide the DQM, CAS, RAS, CS, CKE, WE, BA, and OE control signals for the SDRAM interface.

Upon receiving a test instruction via the host bus 106, the test unit 104 is adapted to seize control of the memory device 102 for performing timing and configuration tests. The test unit 104 begins a timing and configuration test by asserting the TEST_DATA_SEL and TEST_SEL lines, changing the states of multiplexers 116A–D. The test unit 104 then begins a series of read and write operations with the memory device 102. During each series of read and write operations, the test unit 104 changes the delay values of selected delay buffers 124 via the DELAY1 and DELAY2 signals. If the delay values are set to provide adequate timing between the memory controller 100 and memory 102, then each memory transaction can be expected to occur without timing errors. Thus, if the data received via the DATA READ lines during a write operation matches the data that was previously written to that data location, then the test is considered successful. The test unit 104 preferably tracks the results of each memory test in order to optimize the delay settings, as will be discussed in greater detail below.

The memory controller 100 may include a number of alternative embodiments. In one embodiment, the data read signals feed a plurality of programmable receive delay buffers. The output signals of the programmable delay buffers couple to the register 120E, which is connected directly to the INTERFACE CLOCK signal for synchronization. Further, one transmit delay buffer may be used in place of the plurality of delay buffers 124A–D and delays the INTERFACE CLOCK signal to the registers 120A–D. In another alternative embodiment, the delay buffers 124A–D are individually or group programmable. Instead of using a single delay signal, e.g., DELAY1, the test unit 104 provides a delay signal to adjust each of the individual buffers independently. Alternatively, the test unit 104 provides a delay signal to adjust the delay of the control lines, a delay signal to adjust the address signal delay, and a delay signal to adjust the delay of the DATA WRITE lines.

Figure 2:
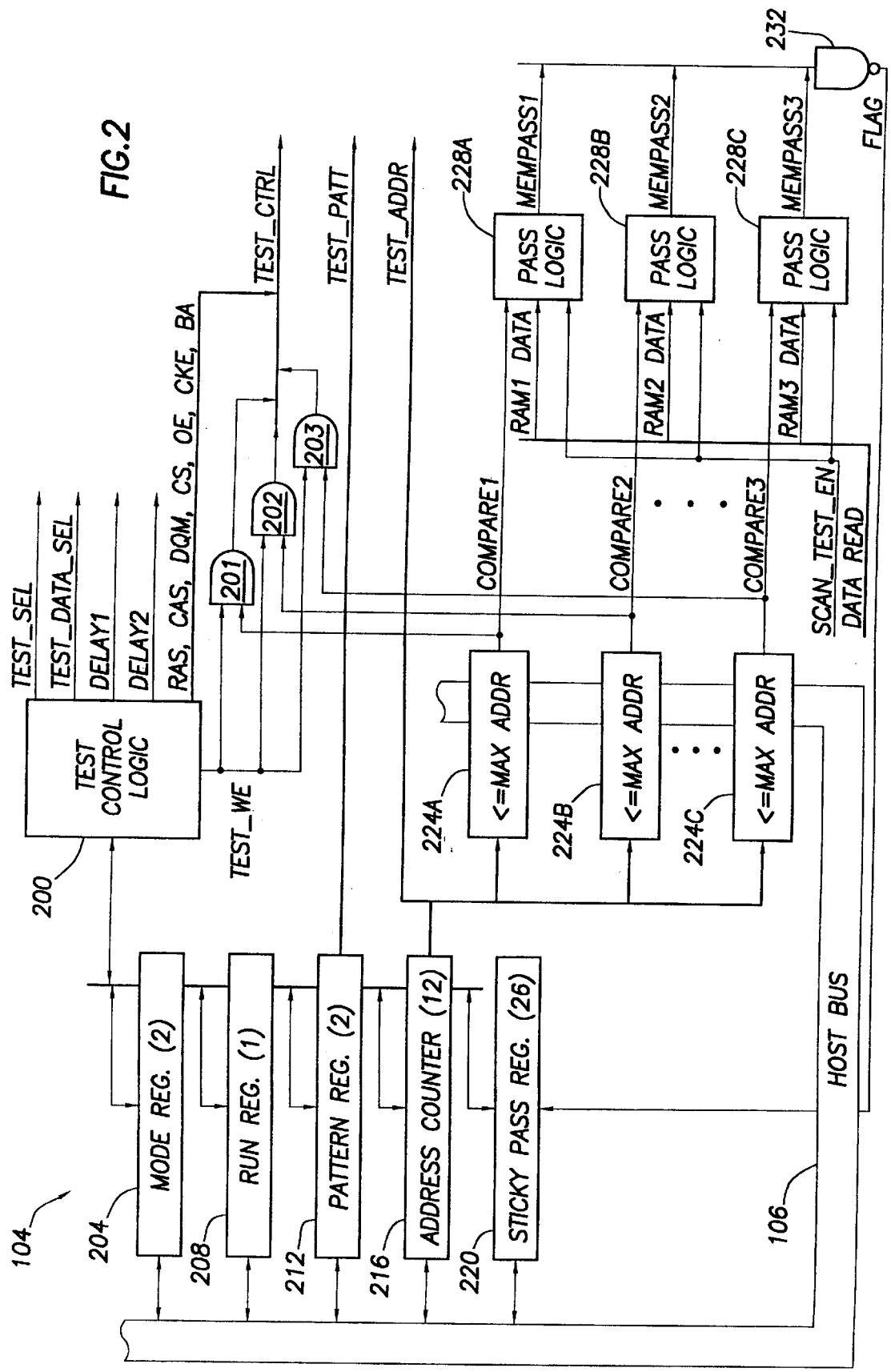
FIG. 2 illustrates the memory test unit of FIG. 1, including a plurality of pass logic units.

Turning now to FIG. 2, the test unit 104 preferably comprises a test control logic 200 coupled to an address counter 216 and a variety of control registers, including mode register 204, run register 208, pattern register 212, and sticky pass register 220. The address counter 216 and registers 204, 208, 212, and 220 further couple to the host bus 106. The test unit 104 also includes a plurality of address control units 224A–C coupled to a plurality of pass logic units 228A–C adapted to receive input data via the DATA READ signals. The pass logic units 228A–C feed a NAND gate 232 that provides a FLAG signal to the sticky pass register 220. The pattern register 212 generates the two-bit TEST_PATT signal, which is used to provide data to main memory 102 during write transactions. The address counter 216 outputs the TEST_ADDR signal, which is used to specify the read and write address during memory transactions. The test control logic 200 provides the DELAY1 and DELAY2 signals for adjusting the programmable delay buffers 224A–E. The test control logic 200 also generates the TEST_SEL and TEST_DATA_SEL output signals, as described above. The test controller 200 additionally provides the control signals RAS, CAS, DQM, CS, CKE, and BA, which form the TEST_CTRL signals used to access main memory 102.

Each address control unit 224 receives the TEST_ADDR lines and provides a COMPARE signal to an associated pass logic unit 228. Each pass logic unit 228 further couples to the DATA READ and SCAN_TEST_EN input signals and provides a MEMPASS signal to NAND gate 232. Thus, the FLAG signal is deasserted if all of the MEMPASS signals are asserted, or is asserted if at least one of the MEMPASS signals is deasserted. The test unit 104 also includes AND gates 201, 202, and 203, which receive the TEST_WE signal from the test control logic 200 and the COMPARE signals transmitted by the address control units 224A–C. The output signals from AND gates 201, 202, and 203 are provided to the main memory 102 via the TEST_CTRL lines as write enable signals.

The values stored the mode register 204, run register 208, pattern register 212, and address counter 216 preferably can be read or written via the host bus 106. In a preferred embodiment, the sticky pass register 220 may be read via the host bus 106 but may not be written to via the host bus 106. The test control logic 200 preferably is capable of both reading and writing to the mode register 204, run register 208, pattern register 212, address counter 216, and sticky pass register 220.

The mode register 204 preferably holds two bits that specify the type of timing test to be performed by the test unit 104. A "00" value in the mode register 204 identifies mode 0, or the normal mode, in which the memory controller 100 performs normal memory transactions for a host computer. During the normal mode, the test unit 104 preferably does not perform timing and configuration tests. Mode 1, identified by the value "01" in the mode register 204, represents a host-controlled test that is used for testing a single memory address while varying the delay settings. In mode 2, identified by the value "10" in the mode register 204, represents the built-in self test mode, in which the test unit 104 tests all memory addresses at various delay settings in order to optimize the buffer delay values. The value "11" in the mode register represents mode 3, which is reserved for future use.

The run register 208 holds a single bit, through which a host computer can initiate a timing and configuration test. To initiate a timing and configuration test, a host computer writes a logic "1" to the run register 208. In response, the test control logic 200 runs the appropriate test as identified by the mode register 204, writing a logic "0" to the run register 208 when the test is finished. A host computer can thereby determine when the test is finished by checking the value of the run register 208.

The pattern register 212 holds the two-bit pattern that forms the data values during a timing and configuration test. Accordingly, the TEST_PATT output signal represents the pattern register 212 contents.

The address counter 216 stores a 12-bit memory address for the current read or write transaction and transmits the TEST_ADDR output signals. Because main memory 102 may include an array of physical memory devices, the test unit 104 preferably includes an address control unit 224 for each physical memory device. Thus, the number of address control units 224 may vary based on the particular memory configuration. Each address control unit 224 receives the TEST_ADDR signals from the address counter 216 and is programmed via the host bus 106 to hold the maximum storage address of its associated memory device. Each address control unit 224 asserts a COMPARE signal if the TEST_ADDR signal represents a memory address that is less than or equal to its maximum allowable memory address. Accordingly, the COMPARE signals are shown in FIG. 2 as COMPARE1 (address unit 224A), COMPARE2 (address unit 224B), and COMPARE3 (address unit 224C). Because different physical memory devices may have different numbers of storage elements, one particular memory address stored in the address counter may exceed the contents of some address control units 224 but not others. If the value of the TEST_ADDR signal exceeds the maximum address stored in an address control unit 224, then that address control unit 224 deasserts its COMPARE signal.

The COMPARE signal from each address control unit 224 is used to gate the write enable signal (TEST_WE) generated by the test control logic 200. Each address control unit 224 feeds a distinct AND gate, as shown in FIG. 2. Address control unit 224A feeds AND gate 201, address control unit 224B feeds AND gate 202, and address control unit 224C feeds AND gate 203. The output of each AND gate 201, 202, and 203 provides a write enable signal for one physical memory device. Consequently, the number of AND gates providing the write enable signals is equal to the number of address control units 224, which corresponds to the number of physical memory devices in the memory array 102. The AND gates 201, 202, and 203 allow the address control units 224 to prevent a write enable signal from being asserted to a physical memory device if the memory address on the TEST_ADDR lines is out of range for that memory device. For instance, AND gate 201 is asserted in response to the TEST_WE signal only if the COMPARE1 signal from address control unit 224A is asserted to indicate that the memory address is within range. Similarly, address control units 224B and 224C prevent AND gates 202 and 203, respectively, from asserting write enable signals if the memory address is out of range for those memory devices.

The pass logic units 228A–C preferably are capable of detecting errors on the DATA READ lines during a timing and configuration test. If the data values from a given physical memory device are correct, then the pass logic unit 228 associated with that memory device asserts a MEMPASS signal to NAND gate 232. If all of the MEMPASS signals are asserted, indicating that the current memory transaction was performed correctly, then the NAND gate 232 deasserts the FLAG signal to the sticky pass register 220. If at least one of the MEMPASS signals is deasserted, however, indicating a memory error, then NAND gate 232 asserts the FLAG signal.

Because a COMPARE signal indicates whether an address control unit 224 has determined that the current memory address is out of range for the associated physical memory device, data received from that device via the DATA READ signals may be determined to be wrong by the pass logic 228 even if the buffer delays are set properly. Thus, if an address control unit 224 deasserts its COMPARE signal, then any memory transaction errors made by the associated physical memory device are ignored when generating the FLAG signal. Accordingly, a pass logic unit 228 always asserts its MEMPASS signal if its COMPARE input signal is deasserted. Similarly, if the SCAN_TEST_EN signal is asserted, the pass logic units 228 assert their MEMPASS signals so that the FLAG signal is deasserted to the sticky pass register 220. Accordingly, the memory controller 100 is adapted to perform standard scan tests without inadvertently causing the FLAG to be asserted.

Each pass logic unit 228 preferably receives DATA READ signals from a physical memory device. As shown in FIG. 2, pass logic unit 228A receives the RAM1 DATA signals from a first physical memory device, pass logic unit 228B receives the RAM2 DATA signals from a second physical memory device, and pass logic unit 228C receives the RAM3 DATA signals from a third physical memory device. Accordingly, each pass logic unit 228 examines only the data lines corresponding to the physical memory device associated with that pass logic and assigns a "grade" of pass or fail via its MEMPASS signal. If a MEMPASS signal is asserted, then the received data is considered error-free. If a MEMPASS signal is deasserted, however, then the associated RAM DATA is considered to have errors. Accordingly, the FLAG signal is asserted only if an error is detected, as indicated by a deasserted MEMPASS signal.

Figure 3A:
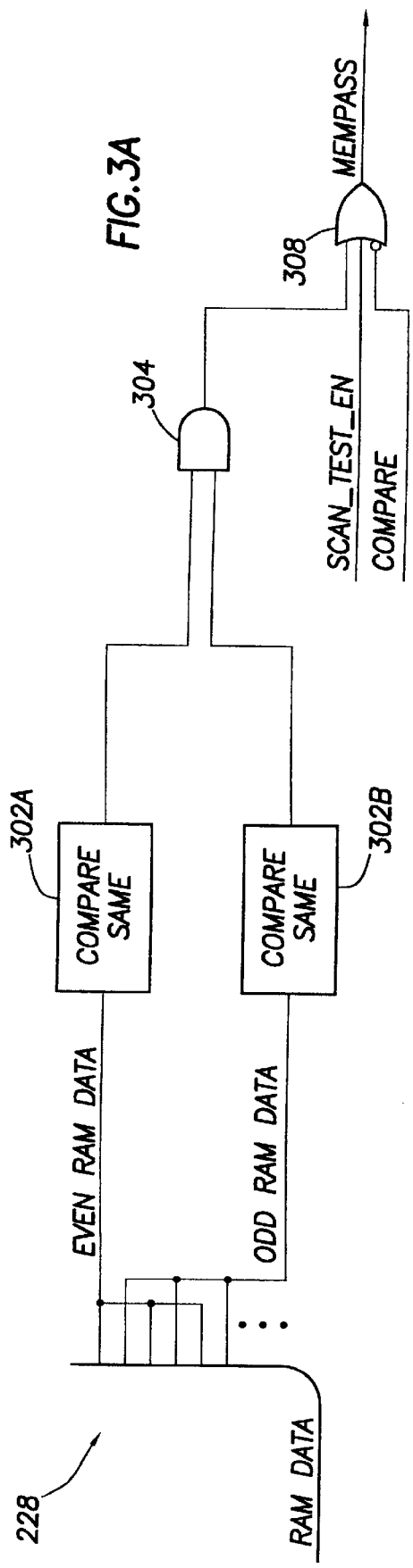
FIG. 3A illustrates the pass logic unit of FIG. 2.

FIG. 3A illustrates a preferred embodiment of pass logic unit 228, comprising a pair of compare same units 302A–B, an AND gate 304, and a three-input OR gate 308 with one inverting input terminal. Each compare same unit 302 receives RAM DATA signals (from the DATA READ lines) and provides an input signal to AND gate 304. The output of AND gate 304, along with the SCAN_TEST_EN and COMPARE signals, drives OR gate 308. The COMPARE signal preferably drives the inverting input terminal of OR gate 308. The output of OR gate 312 comprises the MEMPASS signal, which is asserted to indicate a passed memory test or deasserted to indicate a failed memory test. OR gate 308 asserts the MEMPASS signal if the output signal from AND gate 304 is asserted, if the SCAN_TEST_EN signal is asserted, or if the COMPARE signal is deasserted.

Referring again to FIG. 1, because multiplexer 116A transmits one TEST_PATT signal to the even data lines in the main memory 102 and feeds the other TEST_PATT signal to the odd data lines during a data write, the even DATA READ lines should comprise the same values, and the odd DATA READ lines should comprise the same values following a data read operation. Each compare same unit 302 thus processes either the even or the odd data signals belonging to the associated physical memory device. As shown in FIG. 3A, compare same unit 302A receives the even RAM DATA signals, and compare same unit 302B receives the odd RAM DATA signals for the associated physical memory. Each compare same unit 302 provides a single output signal which is asserted if all of its DATA signals comprise the same logical value. or instance, if all of the even RAM DATA signals are logic "1" or if all of the even RAM ATA signals are logic "0," then compare same unit 300A asserts its output signal to AND gate 304. Similarly, if all of the odd RAM DATA signals are logic "1" or if all of the odd RAM DATA signals are logic "0," then compare same unit 302B asserts its output signal to AND gate 304. If the even RAM DATA signals are a mixture of logic "1" and logic "0," however, then compare same unit 302A deasserts its output signal to indicate a memory transaction failure in the corresponding physical memory device. Likewise, if the odd RAM DATA signals are a mixture of logic "1" and logic "0," then compare same unit 302B deasserts its output signal.

Accordingly, AND gate 304 is asserted only if the even RAM DATA signals comprise the same signal level and if the odd RAM DATA signals comprise the same logic value. Thus, the MEMPASS signal is asserted if the compare same units 302 determine that the data pattern received from main memory 102 is correct. Because the SCAN_TEST_EN signal is fed into OR gate 308 during a scan test, the MEMPASS signal is also asserted during a scan test. Due to the unpredictable nature of the RAM DATA signals during a scan test, keeping the MEMPASS signal asserted prevents the FLAG signal from inadvertently being deasserted during a scan test. OR gate 308 also asserts the MEMPASS signal if the COMPARE signal is deasserted, indicating that the current memory address is out of range for the associated physical device. Because the value of the RAM DATA signal is unpredictable when the memory address is out of range, maintaining an asserted MEMPASS signal if the memory address is out of range prevents FLAG signal from being deasserted to indicate a failure when no verified failure exists.

Referring again to FIG. 2, sticky pass register 220 preferably comprises a twenty-six bit register, although the number of bits may vary in alternative embodiments. Bit 25 preferably indicates whether bits 0–24 are asserted. If bits 0–24 are asserted, then bit 25 preferably becomes asserted. If at least one of the bits 0–24 is deasserted, however, then bit 25 becomes deasserted. The state of bit 25 can thus be read by the test control logic 200 or via the host bus 106 to determine whether all of the sticky bits are asserted. The test control logic 200 preferably provides an address pointer to the sticky pass register 220 that determines which bit is affected by the FLAG signal. Each of the bits 0–24 in the sticky pass register 220 is associated with one possible delay setting for delay buffers 124A–E. Table I below lists the delay assignments of sticky pass register bits 0–24 in a preferred embodiment. The delay levels in Table I range from 0 to 4, with 0 being the least amount of delay and 4 being the greatest amount of delay.

TABLE I

Delay assignments of the sticky pass register bits.

|  | DE-LAY2 = 0 | DE-LAY2 = 1 | DE-LAY2 = 2 | DE-LAY2 = 3 | DE-LAY2 = 4 |
| --- | --- | --- | --- | --- | --- |
| DELAY1 = 0 | Bit 0 | Bit 1 | Bit 2 | Bit 3 | Bit 4 |
| DELAY1 = 1 | Bit 5 | Bit 6 | Bit 7 | Bit 8 | Bit 9 |
| DELAY1 = 2 | Bit 10 | Bit 11 | Bit 12 | Bit 13 | Bit 14 |
| DELAY1 = 3 | Bit 15 | Bit 16 | Bit 17 | Bit 18 | Bit 19 |
| DELAY1 = 4 | Bit 20 | Bit 21 | Bit 22 | Bit 23 | Bit 24 |

As an example from Table I, bit 20 is associated with the largest delay setting (4) of the transmit delay buffers 124A–D and the shortest delay setting (0) of the receive buffer 124E.

During a timing and configuration test, the pass logic 228 continues to deassert the FLAG signal unless a memory transaction fails. If the memory transaction fails, then the FLAG signal is asserted. If the FLAG signal is asserted, then a logic "1" will be written to the sticky pass register 220 to indicate that a memory test failed. If a logic "1" is written to one of the bits in the sticky pass register 220, then that bit preferably remains at logic "1," even if the FLAG signal is subsequently deasserted. Hence, the pass register 220 is said to be "sticky," since a logic "1" value persists when written to the register. The test control logic 200 may set or reset any bit in the sticky pass register 220 to a logic "1" or "0" at any time, however.

The test control logic 200 generally comprises the logic necessary to run timing and configuration tests and to manage the various devices 204, 208, 212, 216, and 220 within the test unit 104. If the mode register is set to mode 2, the test control logic 200 preferably is capable of running an auto-march test if the run register 208 is set. The auto-march test preferably performs read and write transactions to main memory 102 while adjusting the delay buffers 124A–E via the DELAY1 and DELAY2 lines. To begin an auto-march test, the test unit 104 initializes the buffer delay values via the DELAY1 and DELAY2 lines, and the test control logic 200 routes the FLAG signal to the sticky pass register bit associated with the initial delay setting. Accordingly, the sticky pass register bit associated with the initial delay setting becomes asserted if the FLAG signal is asserted. The test control logic 200 then resets the address counter 216 and "marches" through all possible memory addresses, performing read and write transactions to test the main memory 102.

If the timing is adequate between the memory controller 100 and main memory 102 during a timing and configuration test, then the FLAG signal remains deasserted, and the current sticky pass register bit has a value of logic "0" after the test. If a memory transaction fails for any of the memory addresses, however, as indicated by an asserted FLAG signal, then the sticky pass register 220 will flag the failure by storing a logic "1." Even if subsequent memory transactions are accurate, the logic "1" will remain in the sticky pass register 220 to indicate the prior memory failure.

After the auto-march test has covered the entire array of memory addresses using the initial delay settings, the buffer delays are reprogrammed via the DELAY1 and DELAY2 lines, and the memory transactions are repeated again for all memory addresses. The auto-march test finishes when all memory addresses have been tested using all possible combinations of delay settings. For each delay buffer setting, the test control logic 200 routes the FLAG signal to a different bit in the sticky pass register 220. Each bit in the sticky pass register 220, therefore, corresponds to a distinct combination of delay settings. Accordingly, the delay buffers 124A–E can be adjusted by determining which storage locations within the sticky pass register 220 hold a logic "0" following the auto-march test. Because the sticky pass register 220 will flag the appropriate bit if a memory transaction fails, a logic "0" stored in a sticky pass register bit indicates that all memory transactions using the delay settings corresponding to that register bit were error-free during the auto-march test.

Figure 3B:
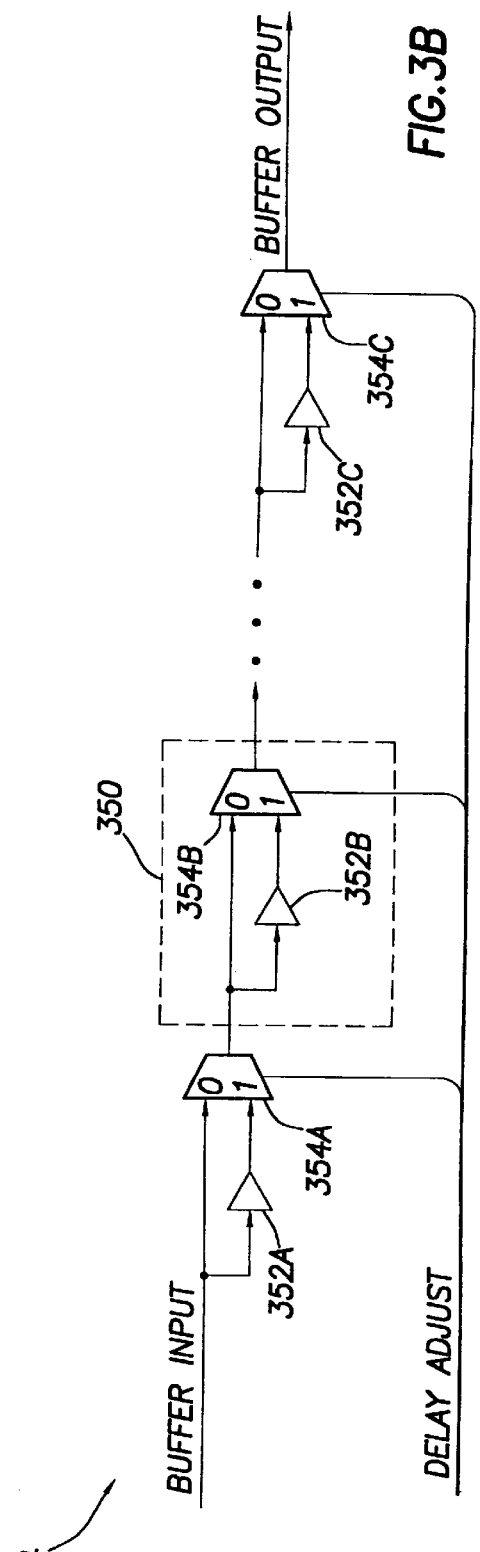
FIG. 3B illustrates a preferred embodiment of the programmable delay buffers of FIG. 1.

FIG. 3B illustrates a preferred embodiment of the programmable delay buffers 124A–E, comprising a plurality of delay stages 350 cascaded in series. Each delay stage 350 comprises a fixed delay buffer 352 coupled to a multiplexer 354. The multiplexer 354 and fixed delay buffer 352 both receive the input signal to the delay stage 350, the multiplexer receiving the input signal through its "0" input terminal. In addition, the output terminal of the fixed delay buffer 352 feeds the "1" input of the multiplexer 354. Accordingly, the multiplexer 354 selects the output of the delay stage 350 as either the input signal to the delay stage or the output signal from the fixed delay buffer 352. The output of each multiplexer 354 is selected by one of the DELAY ADJUST lines.

A plurality of delay stages 350 are shown in FIG. 3B, as including fixed delay buffer 352A and multiplexer 354A (forming the first delay stage), fixed delay buffer 352B and multiplexer 354B (forming the second delay stage), and fixed delay buffer 352C and multiplexer 354C (forming the final delay stage). Because the delay stages 350 are coupled in series, the first delay stage 350 (buffer 352A and multiplexer 354A) receives the BUFFER INPUT signal and feeds an input signal to the second delay stage 350 (buffer 352B and multiplexer 354B). Accordingly, the final delay stage 350 provides the BUFFER OUTPUT signal. It should be understood that any number of delay stages 350 may be included within the programmable delay buffer 124, as desired.

By selecting the "1" input terminal of any of the multiplexers 354 via the DELAY ADJUST lines, the signal through that multiplexer 354 becomes delayed. Accordingly, the time required for a signal to propagate through each of the delay stages 350 depends on how many of the multiplexers 354 are switched to the "1" input terminal. If all of the DELAY ADJUST lines are deasserted, then all of the multiplexers 354 will be switched to the "0" terminals, and there will be virtually no delay through the circuit. If all of the DELAY ADJUST lines are asserted, however, then all of the multiplexers 354 will be switched to the "1" terminals, and the propagation delay of the programmable buffer 124 will be approximately equal to the sum of the delays of each of the fixed-delay buffers 352. In a preferred embodiment, each of the fixed-delay buffers provides a propagation delay of approximately 0.25 nanoseconds (ns).

As would be known to one of ordinary skill in the art, there may be numerous methods of providing the propagation delay introduced by the fixed-delay buffers 352. In one alternative embodiment, a long signal trace is used in place of a fixed-delay buffer 352, creating a delayed signal path. In another embodiment, a polysilicon trace, which conducts an electric signal more slowly than does a metal signal trace, is used in place of a fixed-delay buffer 352. There may be numerous additional ways of implementing the programmable delay buffer 124, as well, without departing from the principles described herein.

Figure 4:
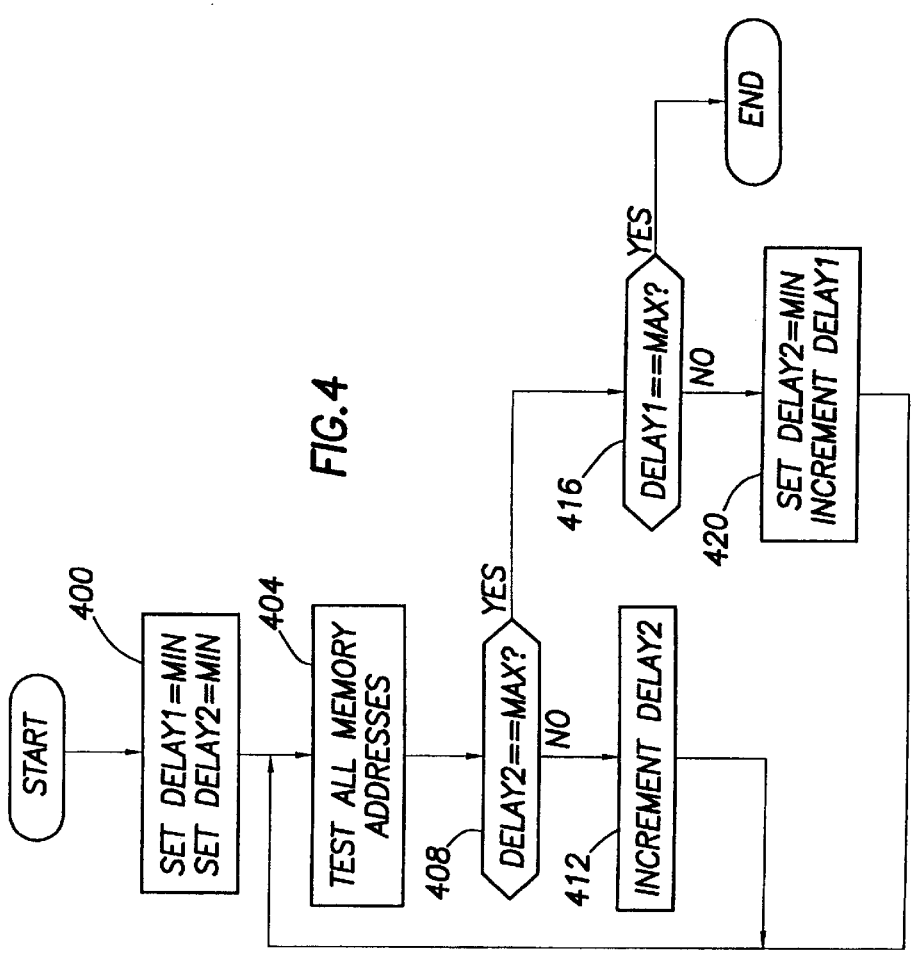
FIG. 4 illustrates a preferred embodiment of the built-in test procedure of the memory controller, including varying the delay settings to optimize the memory interface timing.
Figure 5:
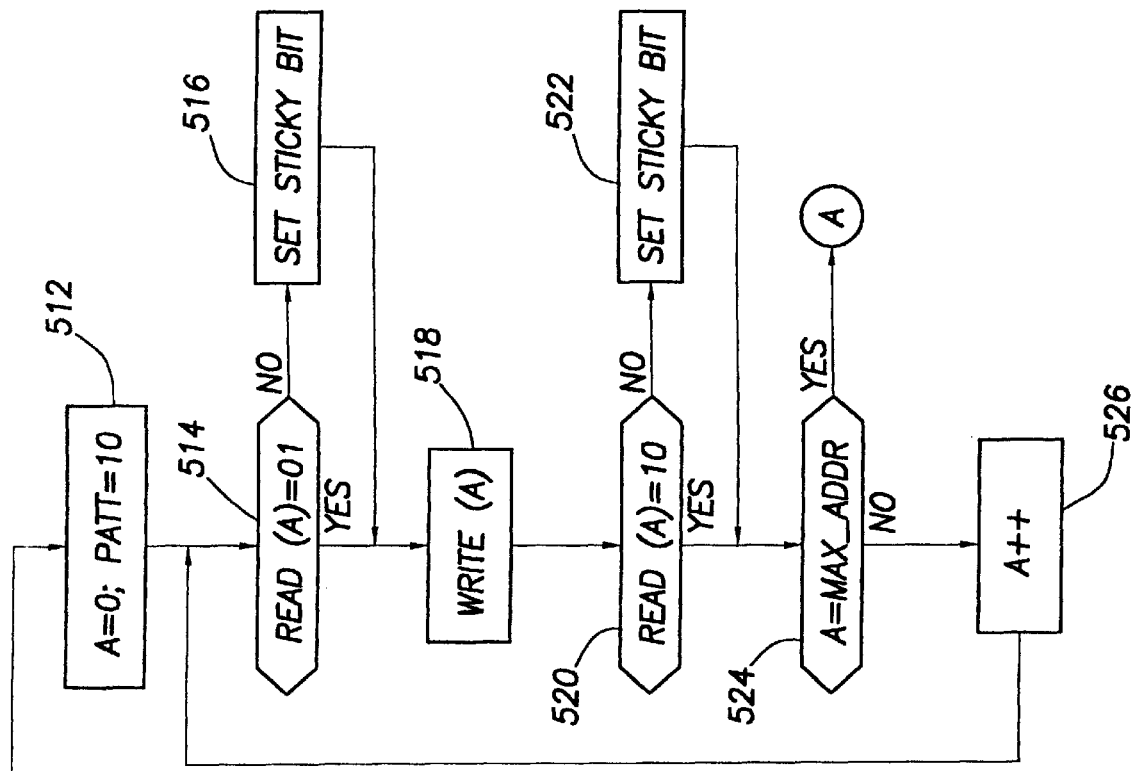
Figure 1:
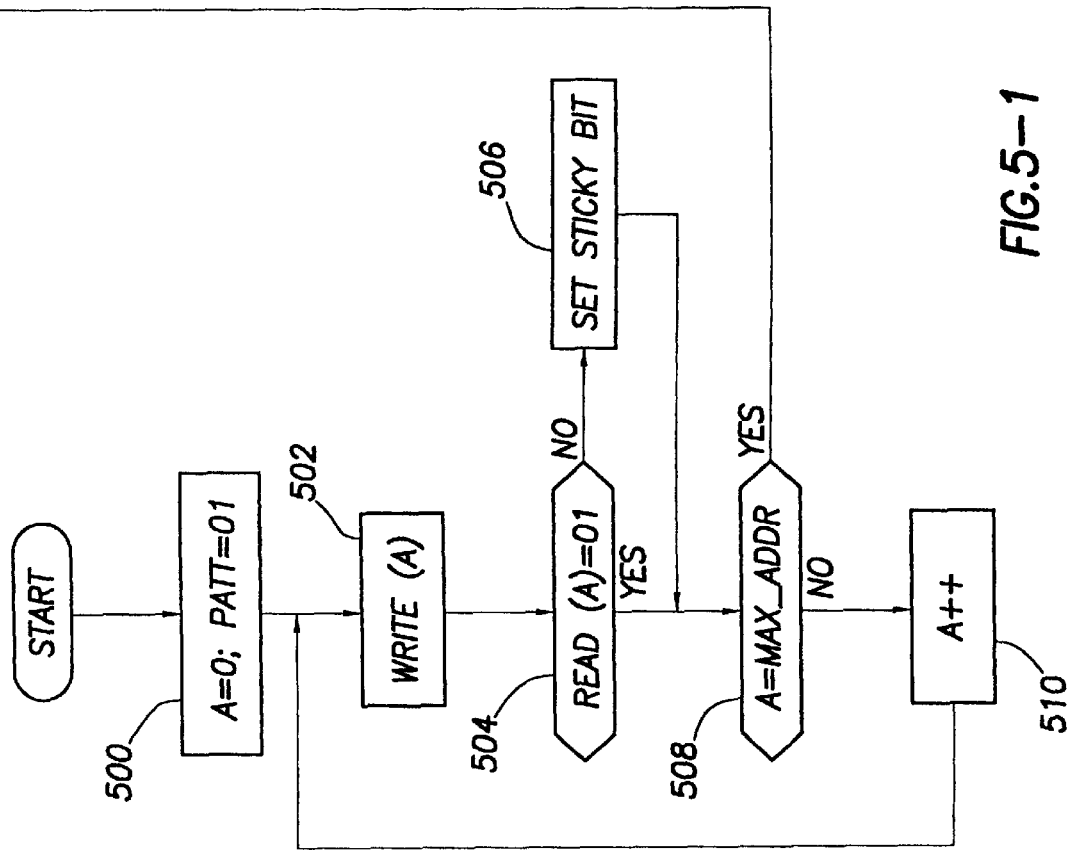
Figure 5:
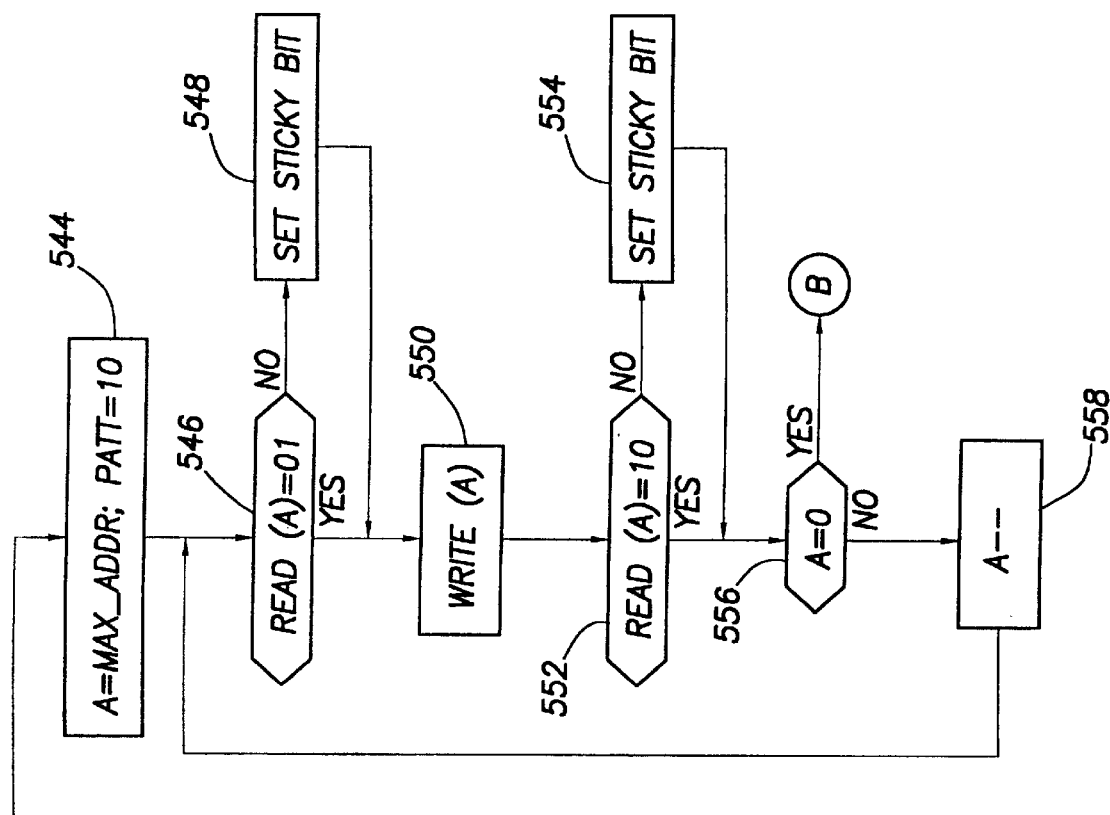
Figure 2:
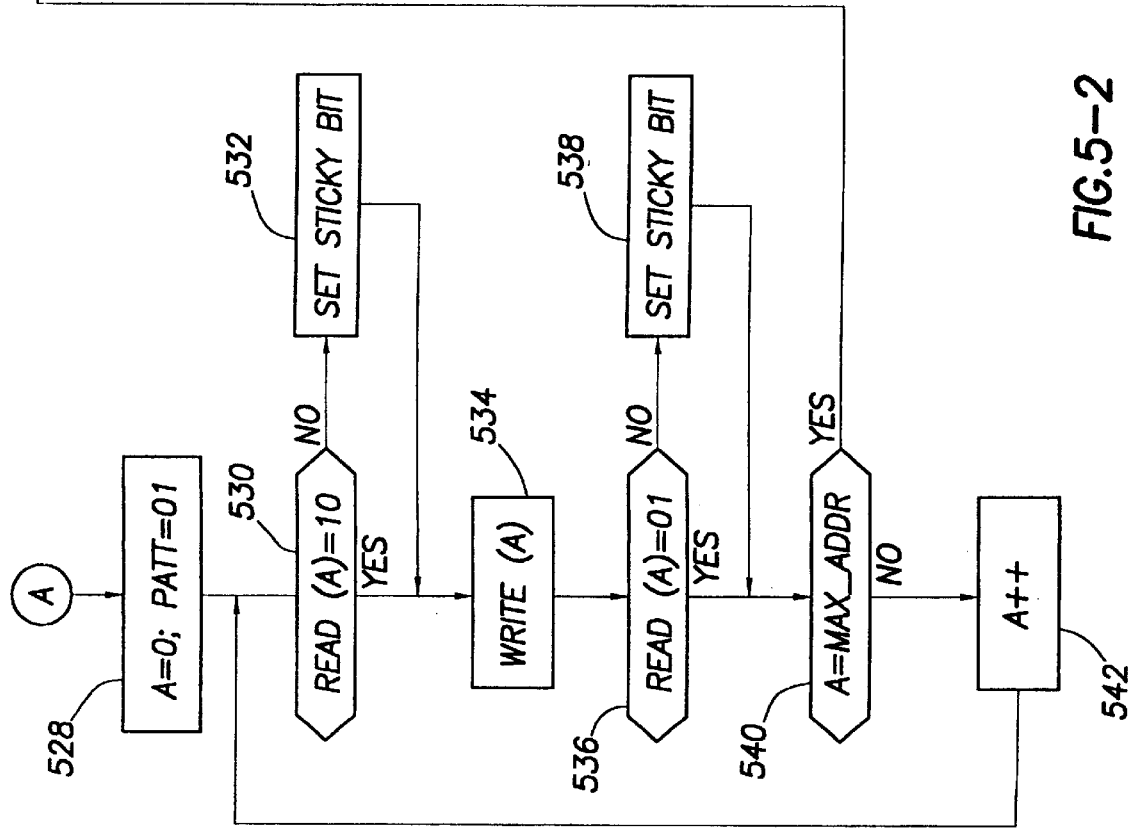

FIG. 4 illustrates a preferred embodiment for testing the main memory 102 during an auto-march test. Beginning with step 400, the transmit delay (DELAY1) of delay buffers 124A–D and the receive register delay (DELAY2) are set to MIN, which corresponds to the minimum delay time of buffers 124A–E, i.e., DELAY1=0 and DELAY2=0. Next, in step 404, the test unit 104 performs a memory test comprising a series of read and write transactions to main memory 102. During step 404, the test unit 104 preferably tests each memory address at least once, moving next to step 408. As will be discussed below, the timing test includes implementing step 404 using various delay values. Accordingly, if the receive register delay (DELAY2) has not reached its maximum value (MAX) in step 408, i.e., DELAY2=4 in a preferred embodiment, then the test control logic 200 increments DELAY2 and repeats the timing test in step 404. If the receive register delay is equal to MAX in step 408, then the test control logic 200, resets DELAY2 to MIN in step 416 and increments DELAY1 in step 420. The timing test is then repeated beginning with step 404. If DELAY1 is equal to MAX in step 416, however, i.e., DELAY=4 in a preferred embodiment, then the timing test ends.

Figures 3, 5:
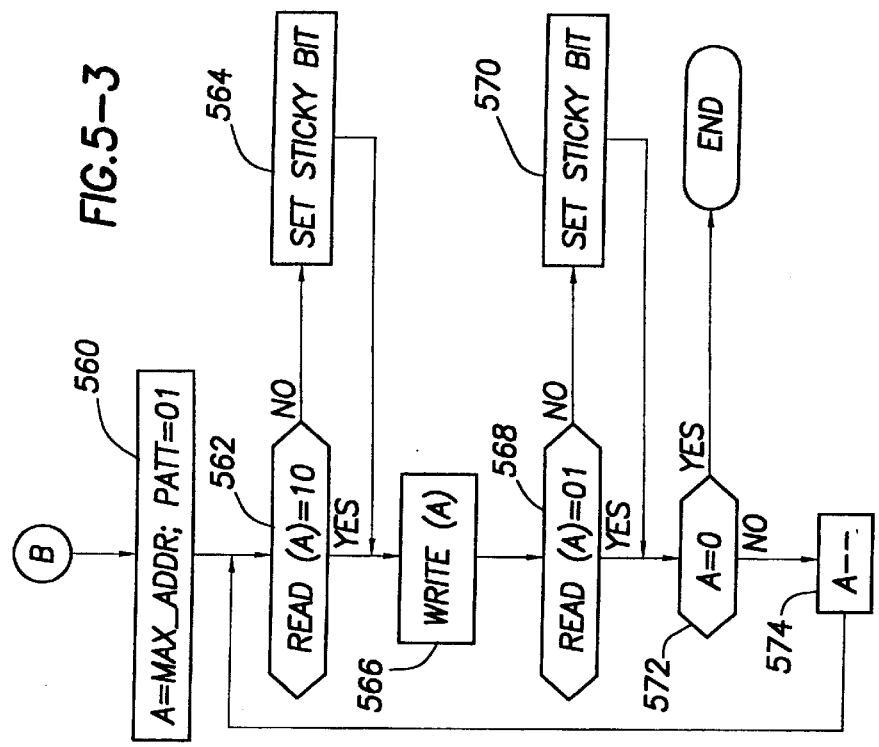

FIG. 5 illustrates a preferred embodiment of the memory test of block 404. The memory test preferably comprises writing data consisting of alternating 1's and 0's to every address within the main memory 102, from the lowest address to the highest address. In order to form the write data as an array of alternating 1's and 0's, either a binary "01" or a binary "10" is stored into the pattern register 212. After each write operation, the same memory address is then read back to check the data. Next, the pattern is changed, and the memory addresses are again tested in consecutive order, from the lowest address to the highest address. This second series of tests includes a read operation followed by a write operation and then another read operation. The first read operation is intended to double check the data written during the previous series. The second read operation serves as a check for the write operation, which records the changed pattern into memory 102.

During the third series, the pattern is again changed and written to all memory addresses, from the smallest address to the largest address. Following the third series, a fourth, and then a fifth series of memory operations complete the test. At the beginning of the fourth and fifth series, the test pattern is changed, and the data is written to the main memory 102 from the highest address to the lowest address. During the third, fourth, and fifth tests, a first read operation is performed before the write operation to check the data written during the previous series, and a second read operation is performed after the write operation to check the data written during the current series.

The test steps shown in FIG. 5 preferably are implemented with the delay buffers 124 fixed at a constant value. Accordingly, one of the sticky register bits is associated with the current delay values. If the data is verified as correct following a read operation, then the pass logic will deassert the FLAG signal in order to maintain the sticky bit at a logic "0" value. The sticky bit will be set to logic "1" if any of the read operations detects an error in the test pattern, however. Furthermore, once the sticky bit is set to "1," the sticky bit preferably remains at "1," even if the FLAG signal subsequently asserts a "0" to the sticky pass register 220.

The first test series begins with block 500, in which the address counter (A) 216 is set to zero, and the pattern register (PATT) 212 is set to binary "01." Next, in step 502, the test pattern is written to main memory 102. The memory address used for the write transaction in step 502 corresponds to the value stored in the address counter 216. Next moving to block 504, data in main memory 102 is read from the address stored in the address counter 216. Note that the address used to read from memory in step 504 is the same as the address used to write to memory in step 502; hence, the data read during step 504 should correspond to the data written during step 502. If the data read in step 504 is not the same as the data written during step 502, then the sticky pass register 220 receives a logic "1" in the sticky bit corresponding to the current timing test (step 506), moving next to step 508. Otherwise, if the data read in step 504 matches the data written during step 502, then step 508 directly follows step 504. In step 508, if the address counter 216 has not yet reached the highest memory address (MAX_ADDR), then the address is incremented in step 510, and the test is repeated beginning with step 502. If the address counter 216 has reached MAX_ADDR in step 508, however, then the test proceeds to step 512.

Step 512 begins the second test series. In step 512, the address counter 216 is again reset to zero, and the test pattern, stored in the pattern register 212, is changed to binary "10." Next, in step 514, the contents of main memory 102 are read from the address stored in the address counter 216. Because the test pattern "01" was written to memory previously in step 502, the data read during step 514 should correspond to the test pattern "01." Hence, if a "01" pattern is not read from the main memory 102, then the sticky pass register 220, in step 516, stores a logic "1" into the sticky bit corresponding to the current timing test. Step 518 follows steps 514 and 516. In step 518, the new test pattern "10" is written to the current memory address (A). Next, in step 520, the main memory 102 is read once again at the current memory address. Because the new test pattern "10" was just written to the memory 102 during step 518, the read operation in step 520 should produce a "10" pattern as well. If the pattern read from main memory 102 in step 520 corresponds to the "10" pattern, then step 524 is implemented. If an error is found in the test pattern in step 520, however, then the sticky bit corresponding to the current delay values is set to logic "1" in step 522. Moving next to step 524, if the current memory address has reached its maximum value (MAX_ADDR), then the test proceeds to step 528. Otherwise, the address counter 216 is incremented in step 526, and the test repeats from step 514.

Steps 528 through 542 form the third test series. Beginning in step 528, the address counter 216 is initialized to zero, and the test pattern (PATT) in the pattern register 212 is set to binary "01." In steps 530, 534, and 536, the main memory 102 is read (step 530), the new test pattern is written (step 534), and then the main memory 102 is read again (step 536). During the first read operation in step 530, the memory 102 should contain the previous test pattern, "10," which was written during step 518. If the memory data does not match the previous test pattern in step 530, then the sticky pass register 220 records a logic "1" for the current bit before moving to step 534. Because the new test pattern "01" is written during step 534, the data that is read during step 536 should correspond to the new test pattern. If the data does not correspond to the new test pattern in step 536, then the sticky pass register 220 records a logic "1" for the current bit, in step 538, before proceeding to step 540. In step 540, if the address counter 216 has reached the maximum address (MAX_ADDR), then the test proceeds to step 544. Otherwise, the address counter 216 is incremented in step 542, and the test repeats from step 530.

Steps 544 through 558 form the fourth test series. In step 544, the memory address is set to MAX_ADDR, and the test pattern is changed to logic "10" in the pattern register 212. Next, a memory read operation is performed to the current address (step 546), followed by a memory write to the current address (step 550), and then another memory read (step 552). Because the test pattern changes in step 544, the data read during step 546 should correspond to the "0138 pattern written during previous step 534. If the data read during step 546 does not match the data written during step 534, then the sticky bit is set to logic "1" during step 548 before implementing step 550. Similarly, the data read during step 552 should correspond to the new test pattern "10," which is written during step 550. If a data error is found during step 552, then the sticky bit is set to logic "1" in step 554, before continuing with step 556. Step 556 represents a test to determine whether the address counter 216 has reached zero. If the address counter 216 has reached zero during step 556, then the test continues with step 560. Otherwise, the memory address (A) is decremented in the address counter 216, and the test repeats from step 546.

Steps 560 through 574 represent the fifth test series. During the fifth series, a new pattern "01" is created in step 560 and written to memory 102, beginning with the highest memory address and continuing to memory address zero. Accordingly, the address counter 216 is set to MAX_ADDR in step 560. Next, a memory read is performed (step 562), followed by a memory write (556), and then another memory read (568). If the memory read data in step 562 does not correspond to the previous test pattern "10," then the sticky bit is set to logic "1" in step 564. Similarly, the sticky bit is set during step 570 if the data that is read during step 568 does not correspond to the new test pattern "01," which was written during step 566. Next proceeding to step 572, if the address counter 216 has reached zero, the test ends. Otherwise, the address (A) is decremented in step 574, and the test repeats from step 562.

After the timing test is completed, the sticky pass register 220 holds the pass/fail test results. If any of the memory timing read or write operations failed during any of the tests, the sticky bit corresponding to the delay settings of the failed test will hold an error flag, or a logic "1." If all of the memory operations were performed successfully under a particular combination of buffer delays, however, then the sticky bit corresponding to those particular delay settings will hold a logic "0." Following the timing test, the test control logic 200 preferably searches the sticky pass register 220 to determine a preferred combination of delay values for setting the delay buffers 124A–E via the DELAY1 and DELAY2 signals.

Table II illustrates an example of how bits 0–24 might appear after a timing test implemented according to FIGS. 4 and 5: ;

TABLE II

Example timing test results.

| | DELAY2 = 0 | DELAY2 = 1 | DELAY2 = 2 | DELAY2 = 3 | DELAY2 = 4 |
|---|---|---|---|---|---|
| DELAY1 = 0 | Bit 0 = 1 | Bit 1 = 1 | Bit 2 = 1 | Bit 3 = 1 | Bit 4 = 1 |
| DELAY1 = 1 | Bit 5 = 1 | Bit 6 = 1 | Bit 7 = 0 | Bit 8 = 0 | Bit 9 = 1 |
| DELAY1 = 2 | Bit 10 = 1 | Bit 11 = 1 | Bit 12 = 0 | Bit 13 = 0 | Bit 14 = 1 |
| DELAY1 = 3 | Bit 15 = 1 | Bit 16 = 1 | Bit 17 = 0 | Bit 18 = 1 | Bit 19 = 1 |
| DELAY1 = 4 | Bit 20 = 1 | Bit 21 = 1 | Bit 22 = 1 | Bit 23 = 1 | Bit 24 = 1 |

In Table II, bits 0–5, 9–11, 14–16, and 18–24 hold error flags (logic 1's), while bits 6–8, 12, 13, and 17 hold logic 0's. The results in Table II thus indicate that the timing tests passed without errors under the delay settings corresponding to bits 6–8, 12, 13, and 17. The delay settings corresponding to bits 6–8, 12, 13, and 17 are therefore considered optimal for the memory controller 100. Table III, below, summarizes the successful delay values corresponding to the exemplary timing test described by Table II:

TABLE III

Successful delay values.

| DELAY1 Value | DELAY2 Value | Sticky Bit |
|---|---|---|
| 1 | 1 | Bit 6 |
| 1 | 2 | Bit 7 |
| 1 | 3 | Bit 8 |
| 2 | 2 | Bit 12 |
| 2 | 3 | Bit 13 |
| 3 | 2 | Bit 17 |

To adjust the delay times of buffers 124A–E for optimal memory signal timing, one of the delay pairs must be chosen from Table III. In a preferred embodiment, an optimal delay pair is chosen by determining which row of Table II contains the fewest error flags and which column of Table II contains the fewest error flags. The delay pair corresponding to the row and column with the fewest error flags, or equivalently the greatest number of 0's, preferably represents an optimal delay setting. For instance, the second row of Table II, which corresponds to DELAY1=1, has three bits (bits 6–8) that are set to logic "0." All other rows in Table II have fewer than three bits that are set to logic "0." Similarly, the third column of Table II, which corresponds to DELAY2=2, has three bits (bit 7, 12, and 17) that are set to 0. All other columns in Table II have less than three bits that are set to 0. An optimal delay pair, therefore, is chosen as DELAY1=1, DELAY2=2, since the row corresponding to DELAY1=1 has the greatest number of 0's of all of the rows, and because the column corresponding to DELAY2=2 has the greatest number of 0's of all of the columns.

The pseudo-code listings below illustrate a preferred embodiment of selecting the delay settings from the sticky bit register 220 following a timing test. The first code listing determines which row in Table II has the greatest number of logic 0's:

Code for Determining the Best Delay1 Value
From the Sticky Pass Register 220

```
1  best_delay1_errors = max_delay2;
2  best_delay1 = -1;
3  for ( delay1 = 0; delay1 < max_delay1; delay1 ++ ) {
4      current_delay1_errors = 0;
5      for ( delay2 = 0; delay2 < max_delay2; delay2++ )
6      {
7          current_delay1_errors += error_flag(delay1, delay2);
8      }
9      if ( current_delay1_errors < best_delay1_errors ) {
10         best_delay1 = delay1;
11         best_delay1_errors = current_delay1_errors;
12     }
```

On line 1, the variable "best_delay1_errors" is used to represent the number of 0's in the row of Table II which has the fewest number of 0's. Hence, the row identified by "best_delay1_errors" is intended to correspond to an optimal value of the transmit buffer delay, corresponding to the DELAY1 signal in FIG. 1. The variable "max_delay2" corresponds to the number of possible receive delay settings, corresponding to the DELAY2 signal in FIG. 1. Because there are five possible values for DELAY2 in a preferred embodiment, "max_delay2" preferably is equal to 5. Because there may be as many as "max_delay2" different errors in each row of Table II, "best_delay1_errors" is set to the worst-case "max_delay2" in line 1. On line 2, the variable "best_delay1" is used to represent row of Table II containing the fewest errors, as identified by the "best_delay1_errors" variable. The variable "best_delay1" is initialized to −1 to indicate that it has not yet been set to identify a particular row.

In lines 3–12, the program loops through all of the possible values of DELAY1 to determine which row of Table II contains the greatest number of 0's. The variable "delay1" is used to define the number of iterations of lines 3–10 and is initialized to zero in line 3. The variable "delay1" is incremented during successive loop iterations and corresponds to the value of DELAY1 in Table II. In line 4, the variable "current_delay1_errors" is initialized to zero and represents the number of 0's in the current row of Table II.

Lines 5–8 comprise a nested loop within the loop of lines 3–10. On line 5, the variable "delay2" is used to define the number of iterations of the nested loop and is initialized to zero. The variable "delay2" is incremented during successive loop iterations and corresponds to the value of DELAY2 in Table II. The error_flag( ) function on line 7 returns a logic "1" if the sticky bit corresponding to the buffer delays represented by the variables "delay1" and "ddelay2" holds an error flag, or a logic "1." For example, reading from Table II, the function "error_flag (3, 2)" will return the value of sticky bit 17, which is equal to logic "0." If the "error_flag ( )" function returns a logic "1," which indicates that the current sticky bit recorded a memory error during the timing test, then "current_delay1_errors" is incremented by one in line 7. Otherwise, "current_delay1_errors" is not changed.

On lines 9–12, the "best_delay1" and "best_delay1_ errors" variables are updated to reflect the results of the current iteration. If the row of Table II corresponding to the value of "delay1" contains fewer errors than the value of "best_delay1 errors," then the variable best_delay1" is set equal to "delay1" to represent the row, containing the fewest error flags, and "best_delay1_errors" set equal to the number of errors represented by "delay1." Following line 12, the program repeats back to line 3 until the loop is exhausted and all rows of Table II have been processed. The variable "best_delay1-errors" will then contain the value of DELAY1 corresponding to the row in Table II with the most 0's.

The second code listing, below, is substantially similar to the first code listing above but determines which column in Table II has the greatest number of logic 0's:

Code for Determining the Best Delay2 Value From
the Sticky Pass Register 220

```
13  best_delay2_errors = max_delay1;
14  best_delay2 = -1;
15  for ( delay2 = 0; delay2 < max_delay2; delay2 ++ )
16      current_delay2_errors = 0;
17      for ( delay1 = 0; delay1 < max_delay1; delay1++ )
18      {
19          current_delay2_errors += error_flag(delay1, delay2);
20      }
21      if ( current_delay2_errors < best_delay2_errors ) {
22          best_delay2 = delay2;
23          best_delay2_errors = current_delay2_errors;
24      }
```

On line 13, the variable "best_delay2_errors" is used to represent the number of 0's in the column of Table II which has the greatest number of 0's. Hence, the column identified by "best_delay2_errors" is intended to correspond to an optimal value of the receive buffer delay, corresponding to the DELAY2 signal in FIG. 1. The variable "max_delay1" corresponds to the number of possible receive buffer settings, or values of the DELAY1 signal in FIG. 1. Because there are five possible values for DELAY1 in a preferred embodiment, "max_delay1" preferably is equal to 5. Because there may be as many as "max_delay1" different errors in each column of Table II, "best_delay2_errors" is set to the worst-case "max_delay1" in line 13. On line 14, the variable "best delay2" is used to represent the column of Table II containing the fewest errors, as identified by the "best_delay2_errors" variable. The variable "best_delay2" is initialized to −1 to indicate that it has not yet been set to identify a particular column.

In lines 15–24, the program loops through all of the possible values of DELAY2 to determine which column of Table II contains the greatest number of 0's. The variable "delay2" is used to define the number of iterations of lines 15–24 and is initialized to zero in line 15. The variable "delay2" is incremented during successive loop iterations and corresponds to the value of DELAY2 in Table II. In line 4, the variable "current_delay2_errors" is initialized to zero and represents the number of 0's in the current column of Table II.

Lines 17–20 comprise a nested loop within the loop of lines 15–24. On line 17, the variable "delay1" is used to define the number of iterations of the nested loop and is initialized to zero. The variable "delay1" is incremented during successive loop iterations and corresponds to the value of DELAY1 in Table II. On line 19, "current_delay2_errors" is incremented if the current sticky bit holds an error flag. Otherwise, "current_delay2_errors" is unaffected.

On lines 21–24, the "best_delay2" and "best-delay2_errors" variables are updated to reflect the results of the current iteration. If the column of Table II corresponding to the value of "delay2" contains fewer errors than the value of "best_delay2_errors," then the variable "best_delay2" is set equal to "delay2" to represent the column containing the fewest memory errors so far in the program, and "best_delay2_errors" set equal to the number of errors represented by "delay2." Following line 24, the program repeats back to line 3 until the loop is exhausted and all Table II columns have been processed. The variable "best_delay2_errors" will then contain the value of DELAY2 corresponding to the column in Table II with the most 0's.

Once the row and column containing the greatest number of 0's are identified, the following code can be used to set the DELAY1 and DELAY2 signals:

Code for Setting Best DELAY1 and DELAY2 Signal Values

```
25  if ( best_delay 1 < 0 ) OR ( best_delay2 < 0 )
        OR ( error_flag(best_delay1, best_delay2) == 1 ) {
26      error( );
27  }
28  else {
29      delay1_signal = best_delay1;
30      delay2_signal = best_delay2;
31  }
```

In lines 25–27, the program checks to ensure that suitable delay values could be found during the preceding instructions. If either "best_delay1" or "best_delay2" has not been set, i.e., if either variable is still initialized to −1, or if the sticky bit identified by "best_delay1" and "best_delay1" holds an error flag, then an error is declared in line 26. If an error is declared in line 26, then suitable delay values could not be found, and the error( ) function is called. The error( ) function may contain an alternate program for finding an optimal delay pair, may set the delay values to a default configuration, or may transmit an error message to the host computer via the host bus 106. If either "best_delay1" or "best_delay2" is equal to −1 in line 25, then it follows that all of the sticky bits must be set to logic "1." If the error_flag( ) function in line 25 returns a logic "1," indicating that the intersection of the best row and best column of Table II corresponds to an error flag, then the error ( ) function preferably is called, as well. In an alternative embodiment, however, the buffer delays may still be determined if at least one of the "best_delay1" or "best_delay2" variables holds a value greater than −1. In lines 28–31, the DELAY1 and DELAY2 signals are set to the delay values in Table II corresponding to the row and column containing the greatest number of sticky bits that are set to logic "0."

Numerous memory tests and test modes may be used in addition to those described in this disclosure. In particular, the data patterns and the order of read and write transactions may be varied as desired to test the memory device in different ways. Further, there may be numerous ways to determine which delay settings to use from the sticky pass register 220 after the memory test is completed. Because the sticky pass register 220 may contain a plurality of deasserted bits, indicating that a variety of delay settings resulted in error-free memory tests, virtually any of the delay settings that correspond to deasserted sticky bits may be used to optimize the memory interface timing.

The principles described herein advantageously permit an existing memory controller design to be incorporated into virtually any computer system using any conventional memory architecture. Because the test unit 104 is capable of optimizing the memory interface timing via the built-in self test, the memory controller timing may be automatically fine-tuned to fit any memory speed or timing requirements. Further, the resulting memory system is less susceptible to manufacturing variations than are conventional memory systems, since any timing problems caused by manufacturing variations can be compensating by reprogramming the delay buffers. In addition, the principles described herein allow a memory controller to be designed without the need to perfectly specify the interface timing requirements prior to the manufacturing stage, thus simplifying the design and lowering the design costs. A memory controller can be designed that roughly approximates the required memory interface timing, and the interface signal timing automatically optimized once the memory controller is operational.

Numerous variations and modifications will become apparent to those skilled in the art once the above disclosure is fully appreciated. It is intended that the following claims be interpreted to embrace all such variations and modifications.

What is claimed:

1. A memory controller capable of interfacing with a memory device, wherein the controller comprises:
    a test unit that transmits address, control, and data write signals and receives data read signals;
    a transmit delay buffer that delays one of the control, address, and data write signals;
    a synchronous register that receives one of the data read signals;
    a receive buffer that delays said one of the data read signals by delaying a clock input to said synchronous register; and
    wherein said test unit controls the timing of the memory interface by adjusting the delays of said transmit buffer and said receive buffer.

2. The memory controller as in claim 1, wherein said test unit performs a memory test comprising a series of memory transactions, and sets the delays of said transmit delay buffer and said receive delay buffer based on the outcome of said memory test.

3. The memory controller as in claim 2 wherein said test unit comprises:
    a test controller that provides the address and control signals and that programs said transmit delay buffer and said receive delay buffer, wherein said test controller is capable of initiating memory transactions;
    a pass register coupled to said test controller and configured to record the outcome of the memory test; and
    wherein said test controller determines the delay settings of said transmit delay buffer and said receive delay buffer according to the value of said pass register.

4. The memory controller as in claim 3, further including:
    a pattern register coupled to said test controller and configured to hold data to be written to a memory device via the data write signals; and
    a pass logic unit coupled to said pass register and configured to determine if the data read signals match the data in said pattern register, wherein said pass logic records the outcome of the memory test into said pass register.

5. The memory controller as in claim 4 wherein said test controller performs memory tests using different delay settings of said transmit delay buffer and said receive delay buffer, said pass register records the outcome of the memory tests, and wherein said test controller adjusts the delays of said transmit delay buffer and said receive delay buffer by searching said pass register to determine which delay settings resulted in no memory errors during the memory tests.

6. The memory controller as in claim 5, wherein the test unit is capable of optimizing the delay settings at the instruction of a host computer system.

7. A memory controller capable of transmitting and receiving memory interface signals, comprising:
    a memory test unit that transmits and receives memory interface signals; and
    a programmable delay buffer that delays one of the memory interface signals,
    wherein said memory test unit performs memory tests using a plurality of different delay settings for said programmable buffer, detects which delay settings cause memory transaction errors, and automatically determines an optimal delay setting based on the outcome of the memory tests.

8. A memory controller capable of transmitting and receiving memory interface signals, comprising:
    a memory test unit that transmits and receives memory interface signals; and
    a programmable delay buffer that delays one of the memory interface signals,
    wherein said memory test unit performs memory tests using a plurality of different delay settings for said programmable buffer, detects which delay settings cause memory transaction errors, and automatically determines an optimal delay setting based on the outcome of the memory tests, and
    wherein said memory test unit comprises:
        a test control logic that performs memory tests via the memory interface signals, said test control logic further capable of adjusting the delay of said programmable buffer;
        a sticky register coupled to said test control logic and which comprises a flag bit associated with a predetermined delay setting of said programmable buffer, wherein said test control logic deasserts the flag bit if a memory test using the predetermined delay setting for said programmable buffer is successful; and
        wherein said test control logic sets the delay of said programmable buffer to the predetermined delay setting only if the flag bit is deasserted following a memory test.

9. The memory controller of claim 8 wherein said memory test unit further includes:
    a pattern register coupled to said test unit and which holds memory write data;

a pass logic unit coupled to said pattern register and which receives memory read data; and wherein said pass logic unit deasserts the flag bit if the memory read data matches the contents of said pattern register.

10. The memory controller of claim 9 wherein said memory controller is capable of receiving run instructions from a host computer to initiate a memory test.

11. The memory controller of claim 9 wherein:

said memory controller comprises a plurality of programmable buffers that delay the memory interface signals;

said sticky register further includes a plurality of flag bits, each of said plurality of flag bits associated with a particular combination of delay settings of said plurality of programmable buffers;

said memory test unit performs memory tests using different combinations of delay settings of said plurality of programmable buffers, wherein the success of each memory test is stored in said sticky register by asserting one of said plurality of flag bits if a memory test fails; and wherein said memory test unit locates one of said plurality of flag bits that is deasserted and adjusts the delay settings of said plurality of programmable buffers according to the combination of delay settings associated with said one of said plurality of flag bits that is deasserted.

12. A method for adjusting the timing of a memory interface, comprising:

(a) using programmable delay buffers to delay memory interface signals;

(b) performing memory transactions using a plurality of different delay values;

(c) detecting memory transaction errors during (b);

(d) determining which delay values were used when the memory transaction errors occurred; and (e) adjusting the delay buffers based on (d).

13. A The method of claim 12 wherein (c) includes asserting register bits to record memory errors.

14. The method of claim 13 wherein each of said register bits represents a set of delay values, and wherein (d) includes:

searching for a register bit that is not asserted; and setting the programmable delay buffers to the delay values indicated by said register bit that is not asserted.

15. A method for optimizing the timing of a memory interface, comprising:

(a) setting the delays of memory interface signals;

(b) performing a memory test; and (c) automatically programming delays of the memory interface signals to delay settings that allow the memory test to pass.

16. The method of claim 15 including performing a memory test for each of a plurality of delay settings.

17. The method of claim 16 including asserting a register bit associated with a particular delay setting if the memory test fails when using said particular delay setting.

18. The method of claim 17 including finding a register bit that is not asserted and programming the delays of the memory interface signals according to the delay settings associated with said register bit that is not asserted.

19. The method of claim 18 including using a first buffer to delay a signal transmitted to a memory device and a second buffer to delay signals received from a memory device, and wherein each register bit corresponds to a distinct combination of delays associated with the first and second buffers.

* * * * *